United States Patent
Matsumura et al.

(10) Patent No.: US 8,417,418 B2
(45) Date of Patent: Apr. 9, 2013

(54) ELECTRONIC CONTROL DEVICE FOR CONTROLLING A PLURALITY OF IN-VEHICLE EQUIPMENT

(75) Inventors: Yasushi Matsumura, Toyota (JP); Eiichi Kamei, Nisshin (JP); Nobumasa Ueda, Nagoya (JP); Dai Ito, Kiyosu (JP)

(73) Assignee: Denso Corporation, Kariya (JP)

( * ) Notice: Subject to any disclaimer, the term of this patent is extended or adjusted under 35 U.S.C. 154(b) by 111 days.

(21) Appl. No.: 13/050,103

(22) Filed: Mar. 17, 2011

(65) Prior Publication Data

US 2011/0231032 A1    Sep. 22, 2011

(30) Foreign Application Priority Data

Mar. 18, 2010 (JP) ................................ 2010-061977

(51) Int. Cl.
*G06F 7/00* (2006.01)
(52) U.S. Cl.
USPC ........................................................... 701/36
(58) Field of Classification Search .................. None
See application file for complete search history.

(56) References Cited

U.S. PATENT DOCUMENTS

| | | | |
|---|---|---|---|
| 5,680,294 A | 10/1997 | Stora et al. | |
| 6,166,627 A * | 12/2000 | Reeley | 340/426.25 |
| 6,807,056 B2 | 10/2004 | Kondo et al. | |
| 6,963,146 B2 | 11/2005 | Zecca et al. | |
| 8,234,035 B2 * | 7/2012 | Iwagami et al. | 701/30.5 |
| 2002/0105228 A1 | 8/2002 | Zecca et al. | |
| 2003/0150509 A1 * | 8/2003 | Stiller et al. | 141/38 |
| 2004/0057211 A1 | 3/2004 | Kondo et al. | |
| 2009/0138137 A1 * | 5/2009 | Iwagami et al. | 701/1 |

FOREIGN PATENT DOCUMENTS

| | | |
|---|---|---|
| JP | 8-274440 | 10/1996 |
| JP | 2004-521798 | 7/2004 |
| JP | 2004-246615 | 9/2004 |

* cited by examiner

*Primary Examiner* — Thomas Tarcza
*Assistant Examiner* — Adam Alharbi
(74) *Attorney, Agent, or Firm* — Nixon & Vanderhye P.C.

(57) ABSTRACT

A control circuit board has a plurality of connectors that can connect each control module circuit board to control a plurality of in-vehicle equipment. A power supply circuit board has a power supply circuit that controls a power supply from a battery to a controlled equipment of the control module circuit boards connected with each connector. The control circuit board and the power supply circuit board are electrically connected and accommodated in a case. When the control module circuit boards are connected with any connector of the control circuit board, the power supply circuit is controlled by the control module and it becomes possible to control the controlled equipment such as engines.

8 Claims, 3 Drawing Sheets

ELECTRONIC CONTROL DEVICE FOR CONTROLLING A PLURALITY OF IN-VEHICLE EQUIPMENT

CROSS-REFERENCE TO RELATED APPLICATION

This application is based on and claims the benefit of priority from earlier Japanese Patent Application No. 2010-61977 filed Mar. 18, 2010, the description of which is incorporated herein by reference.

TECHNICAL FIELD

The present disclosure relates an electronic control device equipped in vehicles that can control in-vehicle equipment.

BACKGROUND

In a conventional technology related to an electronic control device equipped in vehicles that can control in-vehicle equipment, module type electronic equipment disclosed in JP-A-8-274440 is known.

This module type electronic equipment is constituted so that a power source module can be inserted to and detached from a front side of a card cage or a power supply module part.

A power supply module connector is automatically connected with a power supply connector in a backplane when the power source module is completely inserted into a card receptor, and the connection is automatically disconnected when the power source module is detached from the card cage.

Moreover, a daughter circuit card is constituted similar to the connection structure as the above, and an operation power is supplied easily without wiring each other with the power supply relative to the power source module and the daughter circuit card.

An electronic system disclosed in JP-A-2004-246615 is a device adopted for personal computers or servers, and is constituted with a plurality of electronic modules, circuit board modules for control, and power source modules, etc. installed in a case.

A CPU that is a heat generating element and other heat generating elements are installed on each surfaces of the installed electronic modules together with a hard disk etc., and each electronic module is a part of the computer.

Moreover, a respective necessary electrical connection between each electronic module and the circuit board module or the power source module, etc. of the device side is performed by inserting (press-fitting) the connector into a connector of a common wiring circuit board.

A liquid circulation loop is constituted by inserting (press-fitting) liquid connectors of each electronic module into liquid connectors of a liquid cooling jacket at the time of the electric connection, and cooling of each electronic module becomes possible by a coolant that flows in the liquid circulation loop.

By the way, in recent years, the number of electronic control unit (ECU) required for in-vehicle equipment such as an engine and a transmission, etc. equipped in a vehicle increases in order to cope with the demand of making the vehicle with high performance.

However, when the number of the in-vehicle ECU increases, it is necessary to provide an assembly space and a cooling space for each ECU, thus causes a problem that required capacity for equipment in the vehicle increases.

Moreover, the number of wire harnesses that electrically connect between each ECU and between the ECU and power supplies increases according to the increase of ECUs, thus causes a problem that required capacity for equipment in the vehicle further increases.

Since the current used is low and the function of the electronic module is limited, a composition adopted in a personal computer or a server as shown in the above-mentioned JP-A-2004-246615 is insufficient to deal with the electronic control unit for the vehicle that has various functions increasing.

Moreover, the composition of the above-mentioned JP-A-8-274440 has a similar problem.

SUMMARY

An embodiment provides an electronic control device that can smoothly control each item of in-vehicle equipment while saving space.

In an electronic control device according to a first aspect, the electronic control device includes a first circuit board that has a plurality of connectors that can connect control modules configured to control any of a plurality of the in-vehicle equipment, a second circuit board that has a power supply circuit for controlling a power supply to a controlled equipment that is the in-vehicle equipment, which is a controlled target for the control modules connected with the connectors, and a case where the electrically connected first and second circuit boards are accommodated.

When the control modules are connected with the connectors of the first circuit board, the power supply circuit is controlled by the control modules and it becomes possible to control the controlled equipment.

As a result, the control of the in-vehicle equipment becomes possible only by connecting the control modules, which are designed considering the first circuit board, the second circuit board and the in-vehicle equipment designated to be controlled, to the connectors of the first circuit board.

Therefore, since each control module that controls a plurality of the in-vehicle equipment is arranged in the case, a required capacity for equipping the vehicle decreases compared with the case where the ECUs for each item of in-vehicle equipment are dispersed in the vehicle, thus space is saved.

Moreover, since a power supply circuit for each item of in-vehicle equipment to control the power supply is provided in the second circuit board, parts can be shared compared with the case where the ECUs for each item of in-vehicle equipment have dedicated power supply circuits. Further, since the wire harness can be reduced, the case that accommodates both circuit boards can be miniaturized.

Therefore, each item of in-vehicle equipment is smoothly controlled while the space is saved.

In the electronic control device according to a second aspect, the control modules are connected with a plurality of the connectors at the same time so that it becomes possible to control the controlled equipment of the control module.

In the electronic control device according to a third aspect, at least one of an engine, a transmission, a door lock mechanism, or a security device is included in the in-vehicle equipment.

In the electronic control device according to a fourth aspect, at least one of a DC-DC converter, a protection circuit of the power supply, or a connection-cutoff circuit of the power supply is provided in the power supply circuit.

DETAILED DESCRIPTION OF THE PREFERRED EMBODIMENTS

With reference to the drawings, hereinafter will be described an embodiment of an electronic control device of the present invention.

Figure 1:
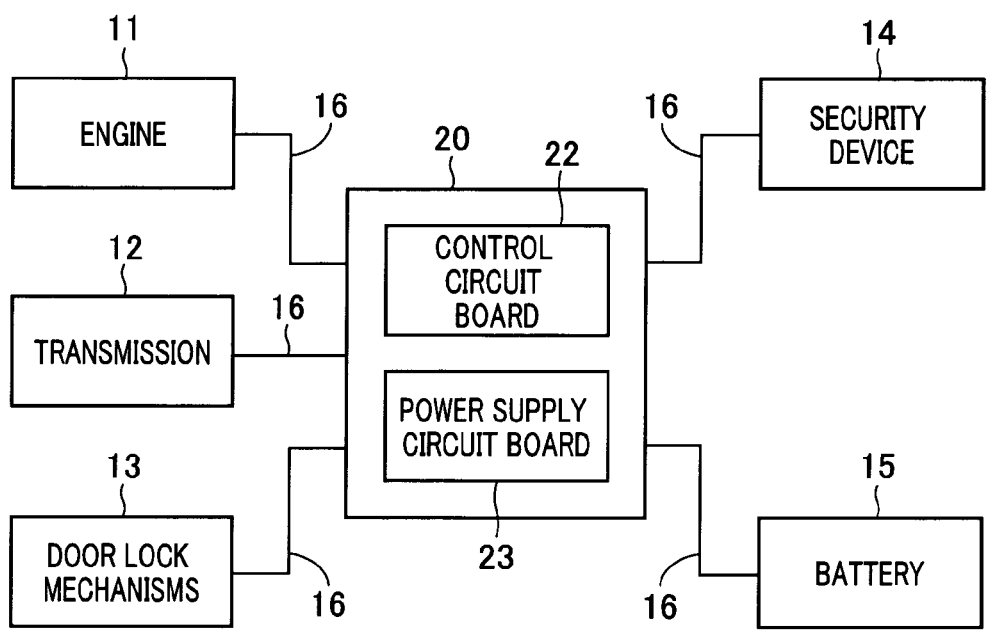
FIG. 1 is a block diagram that shows a connection relationship between an electronic control device and each item of in-vehicle equipment according to a present embodiment.

As shown in FIG. 1, an electronic control device 20 in this embodiment is a device for controlling a plurality of in-vehicle equipment, such as an engine 11, a transmission 12, a door lock mechanisms 13, and security devices 14, etc. in the vehicle, and is arranged in a suitable place in the vehicle.

The electronic control device 20 is electrically connected with each item of in-vehicle equipment 11-14 and a battery 15 that functions as a power supply through wire harness 16, etc.

The engine 11, the transmission 12, the door lock mechanism 13, and the security device 14 may correspond to an example of "in-vehicle equipment" and "controlled equipment" described in the claims.

Figure 2:
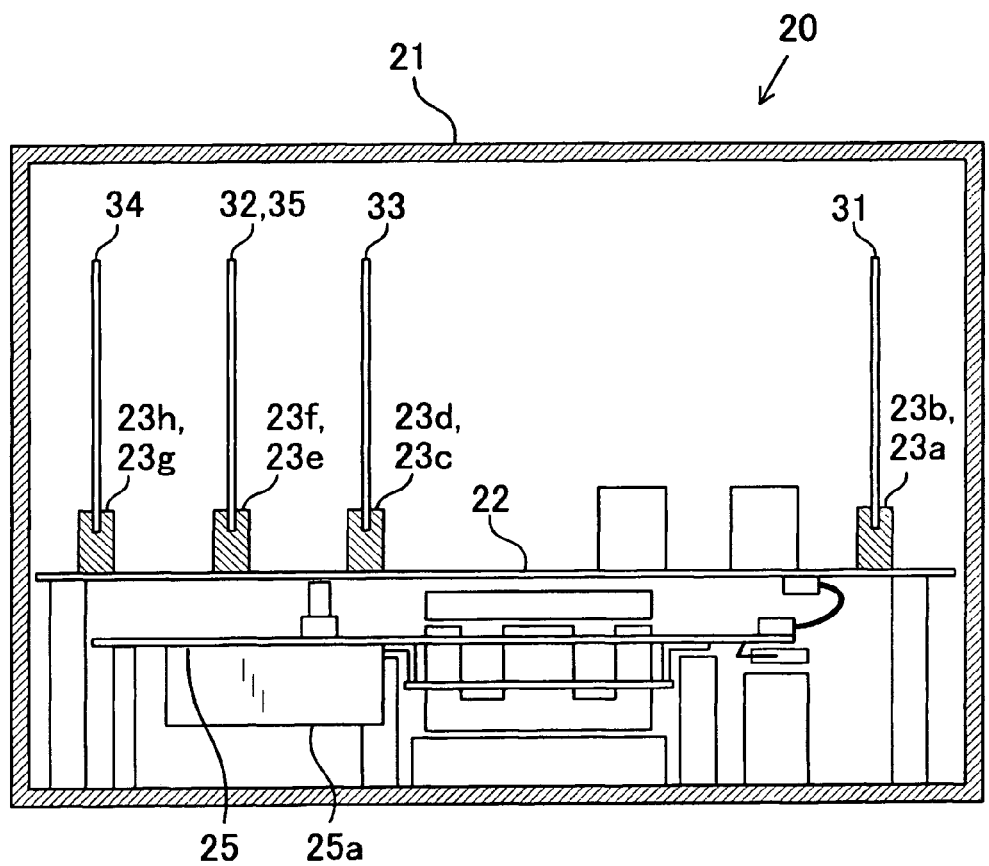
FIG. 2 shows a cross sectional view of the electronic control device shown in FIG. 1.

As shown in FIG. 2, the electronic control device 20 is provided with a rectangular case 21. A control circuit board 22 and a power supply circuit board 25 are electrically connected, and accommodated in the case 21 facing each other with a predetermined space therebetween.

Eight connectors 23a-23h that can connect the control module circuit board configured to control each item of in-vehicle equipment are mounted onto the control circuit board 22 together with a designated electric circuit.

The control circuit board 22 is constituted so that the in-vehicle equipment being controlled (hereafter called controlled equipment) on the control module circuit board can be controlled by the control module circuit board connected with any of the connectors 23a-23h.

Figure 3:
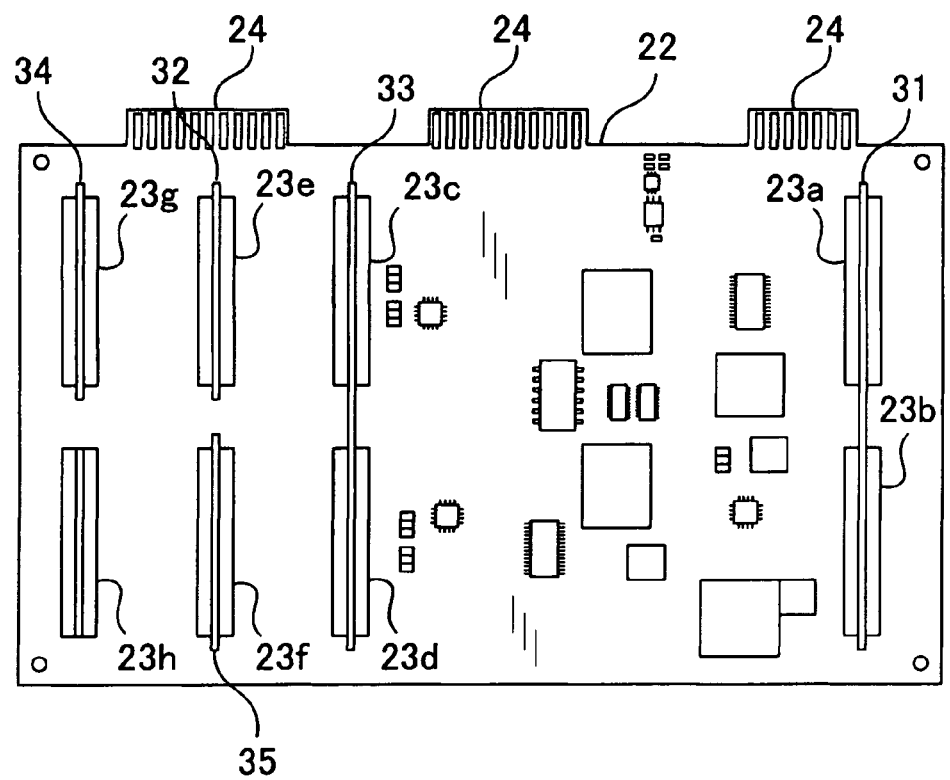
FIG. 3 shows a plane view of a control circuit board shown in FIG. 2 that is seen from the top.

As shown in FIG. 2 and FIG. 3, each connector 23a-23h is arranged so that the connector 23a, the connector 23b, the connector 23c, the connector 23d, the connector 23e, the connector 23f, the connector 23g, and the connectors 23h are arranged on a straight line on a side apart from the power supply circuit board 25.

The number of the connectors may not be limited to eight, but may be more or less according to the type of the in-vehicle equipment assumed as a target to be controlled Moreover, the control circuit board 22 may correspond to an example of "first circuit board" described in the claims.

Here, explaining the control module circuit board mentioned above, a control module circuit board 31 is provided as a conventionally used control module corresponding to an engine ECU that controls the engine 11.

The control of the engine 11 becomes possible by connecting the control module circuit board 31 with any of the connectors 23a-23h of the control circuit board 22.

Moreover, a control module circuit board 32 is provided as a conventionally used control module corresponding to an ECT (electric control transmission) that controls the transmission 12.

The control of the transmission 12 becomes possible by connecting the control module circuit board 32 with any of the connectors 23a-23h of the control circuit board 22.

Moreover, a control module circuit board 33 is provided as a conventionally used control module corresponding to a power management control computer that generally controls the engine ECU and ECT.

The general control of the control module circuit board 31 and the control module circuit board 32, that is, the general control of the engine 11 and the transmission 12 becomes possible by connecting the control module circuit board 33 with any of the connectors 23a-23h of the control circuit board 22.

Moreover, a control module circuit board 34 is provided as a conventionally used control module corresponding to a smart key computer that controls the door lock mechanism and the starting of the engine 11 according to a reception of a predetermined radio signal.

The control of the door lock mechanism 13 according to the reception of the predetermined radio signal and the starting control of the engine 11 become possible by connecting the control module circuit board 34 with any of the connectors 23a-23h of the control circuit board 22.

Moreover, a control module circuit board 35 is provided as a conventionally used control module corresponding to a main body ECU that controls a security device 14 such as a door lock, etc.

The control of the security devices 14 such as the door lock becomes possible by connecting the control module circuit board 35 with any of the connectors 23a-23h of the control circuit board 22.

The control module circuit board 31-35 may correspond to an example of "control module" described in the claims.

Terminals 24 that are exposed from the case 21 are formed in an outer edge portion of the control circuit board 22. The electronic control device 20 is controllably connected to the in-vehicle equipment such as the engines by connecting connectors (not shown) of the wire harness 16 with the proper position of the terminals 24

Although the terminal 24 are formed in one of the outer edge portions in FIG. 3, it is not limited so and the terminal 24 may be formed in all of the outer edge portions, for example.

The power supply circuit board 25 is provided with a power supply circuit 25a for the controlled equipment of the control module circuit board connected with each connector 23a-23h to control and to supply the electric power from battery 15 and a designated electric circuit.

The power supply circuit 25a is provided with a DC-DC converter that boosts the voltage supplied from the battery 15 to a predetermined voltage, a fuse that functions as a protection circuit of the battery 15, a relay that function as a connection-cutoff circuit of the battery 15, and etc.

Therefore, the power supply circuit board 25 is to have a function to distribute the electric power from battery 15 to the designated conventionally used in-vehicle equipment such as an engine compartment J/B (junction block), an engine compartment R/B (relay block), and an instrument panel J/B, etc. controlled by each control module circuit board connected with the control circuit board 22.

Moreover, the target for which the electric power is controlled and supplied by the power supply circuit board 25 is not limited to the controlled equipment of the control module circuit board connected with each connector 23a-23h, but may be one or pluralities of other in-vehicle equipment.

The power supply circuit board 25 and the power supply circuit 25a may correspond to an example of "second circuit board" and "power supply circuit" described in the claims.

In the electronic control device 20 constituted like the above, the control of the controlled equipment becomes possible by connecting the control module circuit board corresponding to the above-mentioned controlled equipment with the connector 23a-23h of the control circuit board 22.

In the present embodiment, as shown in FIG. 3, the control module circuit board 31 is connected with the connectors 23a and 23b, and the control module circuit board 33 is connected with the connectors 23c and 23d.

In addition, the control module circuit board 32 is connected with the connector 23e, the control module circuit board 35 is connected with the connector 23f, and the control module circuit board 34 is connected with the connector 23g.

As for connector 23h, none of the control module circuit boards is connected.

The control of the controlled equipment of the control concerned module circuit board is added by adding other control module circuit boards connected with the connector 23h.

Especially, since there is a lot of I/O volume of information because of the complex control, the control module circuit board 31 and the control module circuit board 33 are connected with two connectors (23a, 23b, 23c, and 23d) at the same time. This is because of the following reasons.

That is, when various in-vehicle equipment becomes targets to be controlled, there exist together control modules that have a large I/O volume of information because of the complex control, and control modules that have a smaller I/O volume of information because of the simple control.

The connectors can be shared even when a plurality of control modules with different I/O volume of information are made to connected target by designing the first circuit board and each connector on the assumption of being connected with a plurality of connectors with the control module having many I/O volume of information.

Moreover, the control of the controlled equipment becomes possible even if each control module circuit board 31-35 is connected with other connectors different from FIG. 3.

For example, the control of the engine 11 becomes possible even if the control module circuit board 31 is connected with the connector 23g and the connector 23h, and the control of transmission 12 becomes possible even if the control module circuit board 32 is connected with the connector 23f.

In the electronic control device 20 of the present embodiment as explained above, there are the control circuit board 22 has a plurality of connectors 23a-23h that can connect each control module circuit boards 31-35 to control any of a plurality of in-vehicle equipment, and the Power supply circuit board 25 that has the power supply to circuit 25a for the controlled equipment of the control module circuit board 31-35 connected with each connector 23a-23h to control the power supply from the battery 15 electrically connected and accommodated in the case 21.

Further, when the control module circuit boards 31-35 are connected with any of each connector 23a-23h of the control circuit board 22, the power supply circuit 25a is controlled by the control module and it becomes possible to control the controlled equipment such as the engines 11.

As a result, the control of the in-vehicle equipment becomes possible only by connecting any one of the control module circuit boards 31-35, which are designed considering the control circuit board 22, the power supply circuit board 25 and the in-vehicle equipment designated to be controlled, to the connectors 23a-23h of the control circuit board 22.

Therefore, since each control module circuit board 31-35 that controls a plurality of the in-vehicle equipment is arranged in the case 21, a required capacity for equipping the vehicle decreases compared with the case where the ECUs for each item of in-vehicle equipment are dispersed in the vehicle, thus space is saved.

Moreover, since the power supply circuit 25a for each item of in-vehicle equipment to control the power supply from battery 15 is provided in the power supply circuit board 25, parts can be shared compared with the case where the ECUs for each item of in-vehicle equipment have the respective power supply circuit. Further, since the wire harness can be reduced, the case 21 that accommodates both circuit boards 22 and 25 can be miniaturized.

In addition, since an individual case or bracket, etc. become unnecessary in each control module circuit board 31-35, stock spaces when assembling can be reduced.

Furthermore, since the parts can be shared as mentioned above, the cost. decrease by the reduction of the parts can be attained.

Therefore, each item of in-vehicle equipment is smoothly controlled while the space is saved.

Moreover, in the electronic control device 20 of the present embodiment, the controlled equipment of the control module circuit board 31 and 32 can be controlled when the control module circuit boards 31 and the control module circuit board 32 are connected to two connectors (23a, 23b and 23c, 23d) at the same time.

Therefore, the connectors 23a-23h can be shared even when a plurality of control module circuit boards with different I/O volumes of information are connected.

As a result, since it is possible to connect a variety of control module circuit boards with the control circuit board 22 so that the control module circuit boards are arranged in an orderly manner, the miniaturization of the control circuit board 22, that is, the miniaturization of the case 21 that accommodates both circuit boards 22 and 25 can be attained.

Moreover, since each control module circuit board 31-35 is arranged in the orderly manner for the control circuit board 22 as mentioned above, a connecting and a rearranging to the control circuit board 22 of each control module circuit boards 31-35 can be easily performed.

In addition, in the electronic control device 20 of the present embodiment, the engine 11, the transmission 12, the door lock mechanism 13, and security device 14 are the controlled equipment as a plurality of in-vehicle equipment, and in each control module circuit board 31-35, any of the above-mentioned controlled equipment becomes the target to be controlled.

By this, the spaces can be saved and the above-mentioned in-vehicle equipment can be controlled smoothly.

Furthermore, in the electronic control device 20 of the present embodiment, the power supply circuit 25a is equipped with a DC-DC converter, fuse, relay etc., and it is possible to supply and control the electric power from the battery 15 to each item of in-vehicle equipment surely.

The present invention is not limited to the above-mentioned embodiment, but may be materialized as follows, and even in that case, the operation and the effect equal to the above-mentioned embodiment can be obtained.

The electronic control devices 20 may be constituted to designate at least one of the engine 11, the transmission 12, the door lock mechanism 13, and the security device 14 mentioned above as a controlled target, and not only to these in-vehicle equipment but also other in-vehicle equipment, for example, an air conditioning system and a display device such as an instrument panel, etc. may be constituted as a controlled target.

In this case, the control module circuit board is constituted so that the above-mentioned control targets are controllable, and is connected with any one of the connectors 23a-23h of control the circuit board 22.

The power supply circuit 25a may be provided with at least one of the DC-DC converter, the fuse, and the relay, and not only to the above-mentioned power supply related parts but also other power supply related parts may be provided.

The control module circuit board is not limited to be connected with one or two of the connectors 23a-23h, but may become possible to control the controlled equipment by being connected with three or more connectors at the same time.

As a result, even if it is an occasion that the control module circuit board with a large I/O volume of information is used because the control is more complex, the same connector as the control module circuit board with a few I/O volume of information can be used, thus the connectors 23a-23h can be shared.

What is claimed is:

1. An electronic control device that can control a plurality of in-vehicle equipment, comprising:
    a first circuit board that has a plurality of connectors that can connect control modules configured to control any of a plurality of the in-vehicle equipment;
    a second circuit board that has a power supply circuit for controlling a power supply to a controlled equipment that is the in-vehicle equipment, which is a controlled target for the control modules connected with the connectors; and
    a case where the electrically connected first and second circuit boards are accommodated;
    wherein, when the control modules are connected with the connectors of the first circuit board, the power supply circuit is controlled by the control modules and it becomes possible to control the controlled equipment.

2. The electronic control device according to claim 1, wherein, the control modules are connected with a plurality of the connectors at the same time so that it becomes possible to control the controlled equipment of the control module.

3. The electronic control device according to claim 1, wherein, at least one of an engine, a transmission, a door lock mechanism, or a security device is included in the in-vehicle equipment.

4. The electronic control device according to claim 1, wherein, at least one of a DC-DC converter, a protection circuit of the power supply, or a connection-cutoff circuit of the power supply is provided in the power supply circuit.

5. A system comprising:
    a first circuit board having a plurality of connectors respectively connected to control module circuit boards, the control module circuit boards being configured to control respective items of in-vehicle equipment;
    a second circuit board having a power supply circuit configured to control a power supply to the respective items of in-vehicle equipment, the second circuit board being electrically connected to the first circuit board; and
    a case housing the first circuit board, second circuit board, and the control module circuit boards;
    the power supply circuit becoming configured to be controlled by the control module circuit boards thereby making it possible to respectively control the respective items of in-vehicle equipment when the control module circuit boards are connected with the connectors of the first circuit board.

6. The system according to claim 5, wherein the control module circuit boards are connectable to a plurality of the connectors at the same time.

7. The system according to claim 5, wherein at least one of an engine, a transmission, a door lock mechanism, or a security device is included in the in-vehicle equipment.

8. The system according to claim 5, wherein at least one of a DC-DC converter, a protection circuit of the power supply, or a connection-cutoff circuit of the power supply is provided in the power supply circuit.

* * * * *